United States Patent
Katayama

[11] Patent Number: 5,926,839
[45] Date of Patent: Jul. 20, 1999

[54] METHOD AND APPARATUS OF BURST READ AND PIPELINED DYNAMIC RANDOM ACCESS MEMORY HAVING MULTIPLE PIPELINED STAGES WITH DRAM CONTROLLER AND BUFFERS INTEGRATED ON A SINGLE CHIP

[75] Inventor: Yasunao Katayama, Sagamihara, Japan

[73] Assignee: International Business Machines Corporation, Armonk, N.Y.

[21] Appl. No.: 08/761,448

[22] Filed: Nov. 22, 1996 Related U.S. Application Data

[30] Foreign Application Priority Data

Dec. 6, 1995 [JP] Japan .................................. 7-317926

[51] Int. Cl.$^6$ .................................................. G06F 13/00
[52] U.S. Cl. ..................... 711/169; 711/104; 711/105; 711/111; 711/170; 365/189.04; 365/189.05; 365/230.08
[58] Field of Search ..................... 711/102, 104, 711/105, 111, 129, 150, 151, 153, 140, 154, 169, 170; 365/189.04, 189.05, 230.08

[56] References Cited

U.S. PATENT DOCUMENTS

| | | | |
|---|---|---|---|
| 5,153,856 | 10/1992 | Takahashi | 365/233 |
| 5,384,745 | 1/1995 | Konishi et al. | 365/230.03 |
| 5,640,527 | 6/1997 | Pecone et al. | 711/5 |
| 5,655,105 | 8/1997 | McLaury | 711/169 |
| 5,749,086 | 5/1998 | Ryan | 711/105 |
| 5,752,269 | 5/1998 | Dividier et al. | 711/169 |

OTHER PUBLICATIONS

Takai et al., "250 Mbyte/s Synchronous DRAM Using a 3–Stage–Pipelined Architecture", Apr. 94, vol. 29, No. 4; pp. 426–431.

Primary Examiner—John W. Cabeca
Assistant Examiner—Tuan V. Thai
Attorney, Agent, or Firm—Robert A. Walsh

[57] ABSTRACT

A single-chip integrated DRAM memory system having a high density and large bandwidth. The single-chip DRAM system includes a DRAM array 10 having a plurality of pipelined stages 12, a control logic 11 for controlling said DRAM array 10 and a buffer 13 integrated onto chip for storing data being fetched from said DRAM array. The DRAM array, control logic, and the buffer are all integrated onto one and the same substrate 1. The control logic 11 generates a control signal for controlling operations taking place in the plurality of pipelined stages and the final stage of said pipeline 12 inputs/outputs data from said buffer means 13 in a burst mode.

5 Claims, 4 Drawing Sheets

METHOD AND APPARATUS OF BURST READ AND PIPELINED DYNAMIC RANDOM ACCESS MEMORY HAVING MULTIPLE PIPELINED STAGES WITH DRAM CONTROLLER AND BUFFERS INTEGRATED ON A SINGLE CHIP

BACKGROUND OF INVENTION

1. Field of the Invention

The present invention relates to a DRAM-based electronic computer memory system utilizing an ultra-high-density DRAM technique and more specifically to upgrading the data transfer rate in a DRAM.

2. Background Art

In a system using an ultra-high-density DRAM, it is expected that the whole memory system will be integrated onto a single or a few (on the order of two or three) chips. This is because, in relatively small-sized computers such as personal computers, increases in density resulting from advances in DRAM integration techniques are ahead of increases in the capacity of main memory. For example, a main memory capacity of around 8 MB is needed for a personal computer but 64 MB of DRAM can be implemented with a single chip. In addition, there is a high possibility of 256 MB DRAMs being put to practical use in the near future.

Under such circumstances, rather than (1) incorporating a DRAM interface into the CPU, (2) integrating the DRAM control logic together with the DRAM array and connecting the integrated chip directly to a CPU bus would improve cost performance. When a great number of DRAM chips are needed to configure a main memory, a scheme for integrating DRAM control logic together with the DRAM array onto a single chip is extremely expensive, since a large integrated area is used for DRAM control logic. The reason for this is that the control logic must be integrated onto each DRAM chip and consequently the total number of DRAM control logics in the memory system increases. However, if the main memory can be composed of a single DRAM chip as is mentioned above, it is only necessary to integrate a single DRAM control logic onto one and the same chip, so that an increase in the chip area is not as critical. In brief, at present, the scheme (1) for incorporating a DRAM interface into the CPU is employed because the scheme (2) for integrating a DRAM control logic together with a great number of DRAM arrays leads to an increase in chip size and package cost and moreover complicates the testing of products. However, as the number of DRAMs used in relatively small-sized personal computers decreases as a consequence of the higher density in recent DRAM integration, the cost problem caused by such a factor is being solved. What is also of importance is that employing the scheme (2) for integrating the respective DRAM control logic together with DRAM arrays into a single chip makes it possible to bring about a great advantage in the performance of memories from the following two points of view.

Firstly, in techniques such as synchronous DRAM and burst EDO (Extended Data Out) for the interface of conventional DRAMs, stress is laid on speeding-up the clock. Accordingly, the scheme (1) cannot always be satisfactory in making use of bus cycles without waste.

Secondly, optimization of a critical path is more easily achieved between the DRAM array and DRAM control logic than between the CPU and the DRAM control logic. In other words, it requires longer time and more elaboration to optimize a critical path between the CPU and the DRAM control logic. For example, overhead due to the multiplexing of addresses cannot be avoided. Moreover, the speedier operation is, the more difficult it becomes to control skew in clock signals transferred between the chips.

Conventionally, a scheme for the provision of an external cache has been employed to upgrade the data transfer rate of DRAMs. However, the bus utilization ratio of DRAM has improved to equal the bus utilization ratio of SRAM in a cache memory, and moreover if the lead-off cycle (period of time from the initiation of RAS to the initiation of CAS) is shortened by integrating the DRAM control logic together with the DRAM array, a transfer rate comparable to that obtained when an external cache is provided can be implemented. Thus, the merit of attaching an off-chip external cache memory loses merit. What is worse, since connection of an external cache necessarily generates an overhead due to the data transfer between the external cache and the DRAM, performance may actually be lowered due to this cause. This deterioration of performance becomes conspicuous in a multimedia-type of application in which very great quantities of data must be transferred at high speed and therefore a solution using attachment of an external cache has the danger of worsening performance in addition to the increase in cost originating from the external cache.

A critical problem in the operational performance of DRAM in the conventional technique is the low speed of the data transfer rate in the path of row access. Speeding-up of the data transfer rate in column access has been fully studied e.g., in techniques such as synchronous DRAMs. However, research has not made as much advance in the data transfer rate for row access as in the data transfer rate for column access. That is, with the increasing data transfer rate in column access, the relatively slower row access is becoming the critical path in 4-beat burst mode operation. In fact, since the page miss ratio between consecutive burst actions (probability of necessary data being present in the same row in the next access) can be as much as 50%, row access takes place fairly frequently.

As a solution to this problem, it is possible to raise the data transfer rate by an appropriate pipelined operation in the interface between the CPU-DRAM or in the row access process for the DRAM (e.g., the address pipeline of the CPU). In a DRAM, individual steps of sensing, writing back and precharging must be accomplished in that order. Accordingly, the array time constant (the total time taken for sensing, writing back and precharging) becomes the time required for the data transfer of the DRAM. In data transfer between DRAMs, not only the time for the operational steps of sensing, writing back and precharging, but also the time for selecting row addresses and column addresses is necessary. Pipelining enables the time taken for selection of these addresses to be concealed behind the operational steps of sensing, writing back and precharging. Thus, the period of time for accessing two successive row addresses (the time taken for selection of the row address + the time taken for sensing, writing back and precharging, referred to as the RAS cycle hereinafter) can be made close to the time taken for sensing, writing back and precharging (referred to as the array time constant hereinafter). Certain conventional techniques disclose pipelined DRAMs having a row access path. In none of these conventional techniques, however, does the RAS cycles reach the array time constant.

The points mentioned above, especially the high integration of DRAM chips owing to the advance in LSI technique and the flow of the background art will be outlined referring to FIGS. 1–3. FIG. 1 shows an ordinary memory system using DRAM. This memory system is divided into numerous DRAM chips 10. This is because the integrated density of the current DRAM chip is too small for the capacity required for uses of the main memory so that a single DRAM chip cannot constitute the main memory. To control the plurality of DRAM chips, an off-chip DRAM controller 11 is required between the CPU (not shown) and the DRAM chips 10. As shown in FIG. 1, a DRAM controller 11 receives a memory access request from the CPU and supplies a row address and column address. Data outputted from a DRAM chip 10 is transferred through the DRAM controller 11 to the CPU. Data inputted to a DRAM chip 10 is processed similarly. However, according to such an off-chip scheme, the signal path between the controller 11 and a DRAM chip 10 lengthens and accordingly it is difficult to synchronize the addressing with the other operations of the DRAM with control of the delay of the control signal for RAS, CAS and the like. This difficulty becomes conspicuous especially in the case of high-speed data transfer.

Advances in the high-density integration techniques for DRAM enable the memory capacity required for a relatively small-sized computer to be almost satisfied with one or at most a few DRAM chips. As a result, the DRAM array 10 (corresponding to the DRAM chips in FIG. 1) can be integrated onto the same chip 1 as that of the DRAM controller 11, as shown in FIG. 2. In other respects, FIG. 2 is similar to FIG. 1. The technique relevant to FIG. 2, in which both are integrated on one and the same chip 1, is expected to upgrade operational performance and cost-saving somewhat, as compared with that of FIG. 1, in that one level of packaging is omitted. However, the upgrade of performance does not differ greatly from that obtained when the DRAM controller 11 is incorporated into the CPU and consequently has no technically significant effect.

FIG. 3 shows a DRAM configuration using pipelining of synchronous DRAMs or the like. A DRAM chip 10 is characterized by having a DRAM pipeline 12 formed inside it. However, this DRAM pipeline 12 is controlled by an external RAS (row address strobe) and CAS (column address strobe). Thus, the control of pipelines inside individual DRAMs becomes restrictive.

Several techniques other than pipelining have so far been proposed to upgrade the operational speed of DRAM.

Page Hit Scheme

The page hit scheme is a scheme to utilize the sense amplifier in a DRAM as a cache as well. The locality of data or an instruction in a page (here designating a row in the DRAM) is effectively utilized under a normal page mode in the DRAM. However, when an on-chip cache is connected to the CPU, the page hit ratio between two continuous cache line transfers is not so high. And the larger the capacity of the on-chip cache is, the lower the page hit ratio becomes. Thus, considering the delay for comparison of tags at the time of a page miss, the precharging time and the like, a significant upgrade in the operational speed of a DRAM cannot be expected even if the page hit scheme is employed.

Interleave Scheme

The interleave scheme is a scheme for dividing a memory into a plurality of banks and accessing these banks in sequence. This scheme is also often employed to raise the data transfer rate of DRAM. In the case of off-chip interleaving for a relatively small-sized computer, however, the granularity of memory (designating the minimum unit of additive memory installation) increases. For example, when a memory is divided into two banks, granularity doubles, which is a serious problem in an ultra-high-density DRAM. On the other hand, in the case of on-chip interleaving, the band-width can be increased without a great effect on the granularity of the memory. However, generally speaking, this technique is effective in upgrading the operational speed of DRAM only at the time of operations where different memory banks are alternately accessed. Thus, it lacks of generality as a scheme for upgrading the data transfer rate.

OBJECTIVES OF THE INVENTION

It is a first object of the present invention to provide a high-density and low-cost DRAM memory array having a high data transfer rate.

It is a second object of the present invention to integrate a DRAM control logic together with a pipelined DRAM array onto a single chip and optimize access to the DRAM array for achieving the first object.

It is a third object of the present invention to make the leadoff and precharge cycle in DRAM access less than in DRAM access in the prior art. This minimization must be possible for both write and readout access and for both single-beat access and continuous-beat access (burst mode).

It is a fourth object of the present invention to provide a memory system comprising a single chip or a few chips without the need for addition of a cache memory using SRAM cells and without lowering operational performance.

Furthermore, it is a fifth object of the present invention to provide a memory system comprising a single chip or a few chips applicable to multimedia use in which a large quantity of data is transferred at high speed.

SUMMARY OF THE INVENTION

These objects of the present invention can be achieved by using a single-chip DRAM system comprising a DRAM array with a plurality of pipelined stages, a control logic for controlling said DRAM array, and buffer means for storing data fetched from said DRAM array, all of which are integrated onto one and the same chip. In this DRAM system, the control logic generates a signal for controlling operations taking place in said plurality of pipelined stages. In addition, the final stage in the plurality of stages is a stage for inputting/outputting data from said buffer means in burst mode. Consequently, with the present invention, for some burst lengths the period of time for inputting/outputting data in burst mode can be made longer than that for internal operation in the DRAM array, and therefore the internal operation in the DRAM array can be perfectly hidden behind data inputting/outputting operation.

The key points of the present invention are first, a DRAM control logic and a DRAM array are mounted together on a single chip, second, a pipelined DRAM is controlled with a clock generated by the on-chip DRAM control logic, and further, synchronous burst transfer is executed by a line buffer as the final stage in the pipeline.

DETAILED DESCRIPTION OF THE PREFERRED EMBODIMENT

Figure 1:
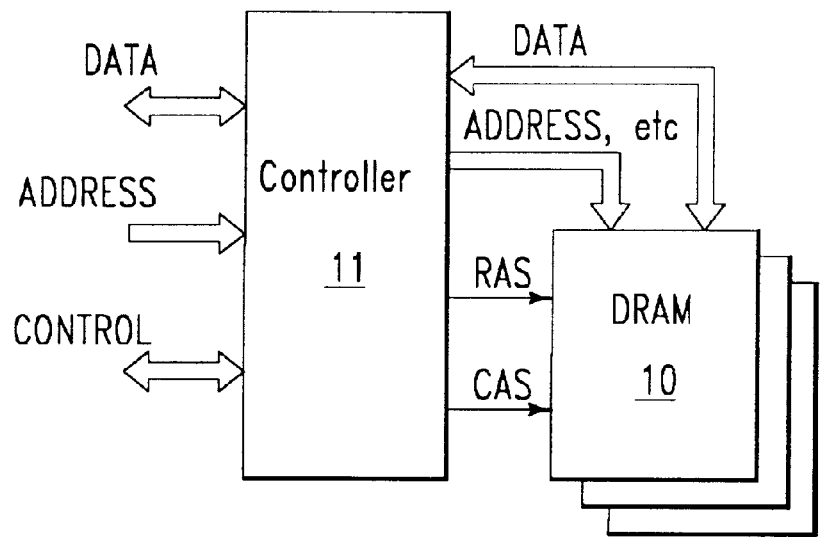
FIG. 1 shows a memory system using a DRAM according the background art.
Figure 2:
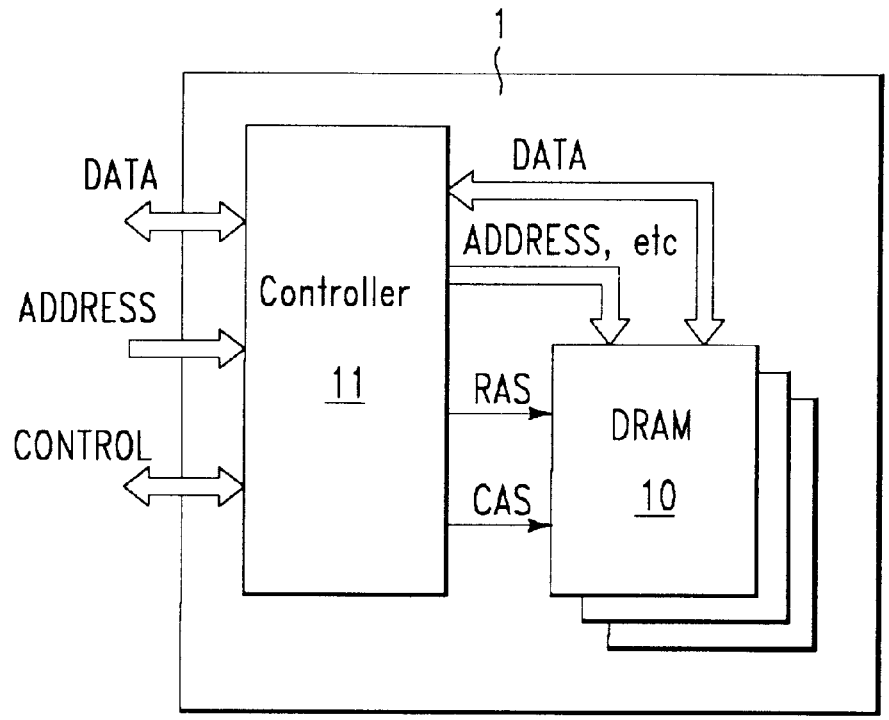
FIG. 2 shows another memory system using a DRAM according the background art.
Figure 3:
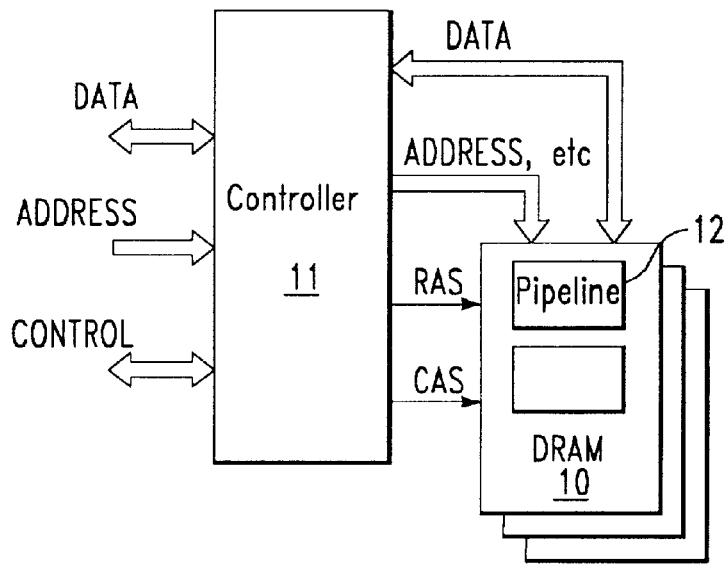
FIG. 3 shows still another memory system using a DRAM according the background art.

Referring to the drawings, preferred embodiments of the present invention will be disclosed hereinafter. First, the difference between the background art, as seen from the standpoint of the flow of technology seen in FIG. 1 to FIG. 3, and the present invention will be described from the view point of the DRAM configuration and control scheme by using FIG. 4.

Figure 4:
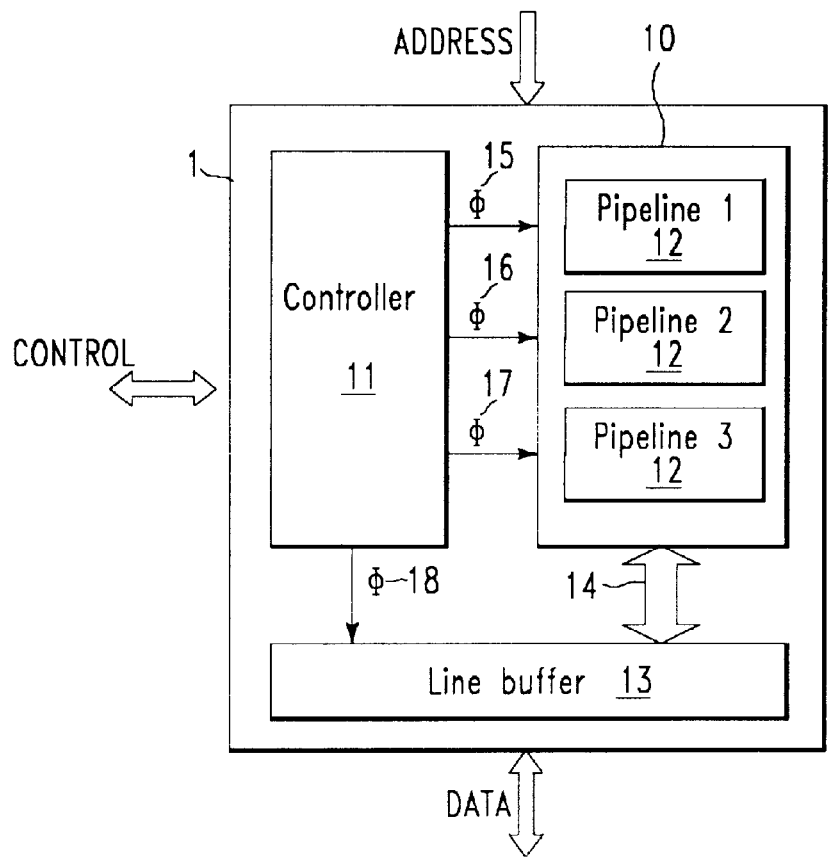
FIG. 4 is a general view of a DRAM system according to the present invention.

The present invention is shown in FIG. 4. With the present invention, a plurality of pipelines 12 are used in a DRAM array 10 and the respective pipelines are controlled by a DRAM controller 11 which are all integrated onto a single chip 1. In addition, a line buffer 13 is integrated onto the same chip 1. This line buffer 13 can be understood as the final stage in the pipeline. The DRAM array 10 and the line buffer 13 are connected by a wide-bandwidth on-chip bus 14. Simultaneously with operation of each pipeline, data can be transferred between the DRAM array 10 and the line buffer 13. The DRAM controller 11 is also integrated on-chip onto the chip 1. The DRAM controller 11 controls bidirectional data transfer between each stage in the pipeline 12 and the DRAM array 10/line buffer 13 with independent clock signals 15, 16, 17 and 18. According to this scheme, more flexible and more precise control related to the pipeline 12 becomes possible. This is because a limit need not be placed on the number of control signals for the DRAM and only a small skew is present between the clock signals 15–18 used for control. To raise the data transfer rate, read/write has conventionally been performed in a plurality of line buffers, but the present invention is characterized in that a single line buffer is used for the whole system.

Figure 5:
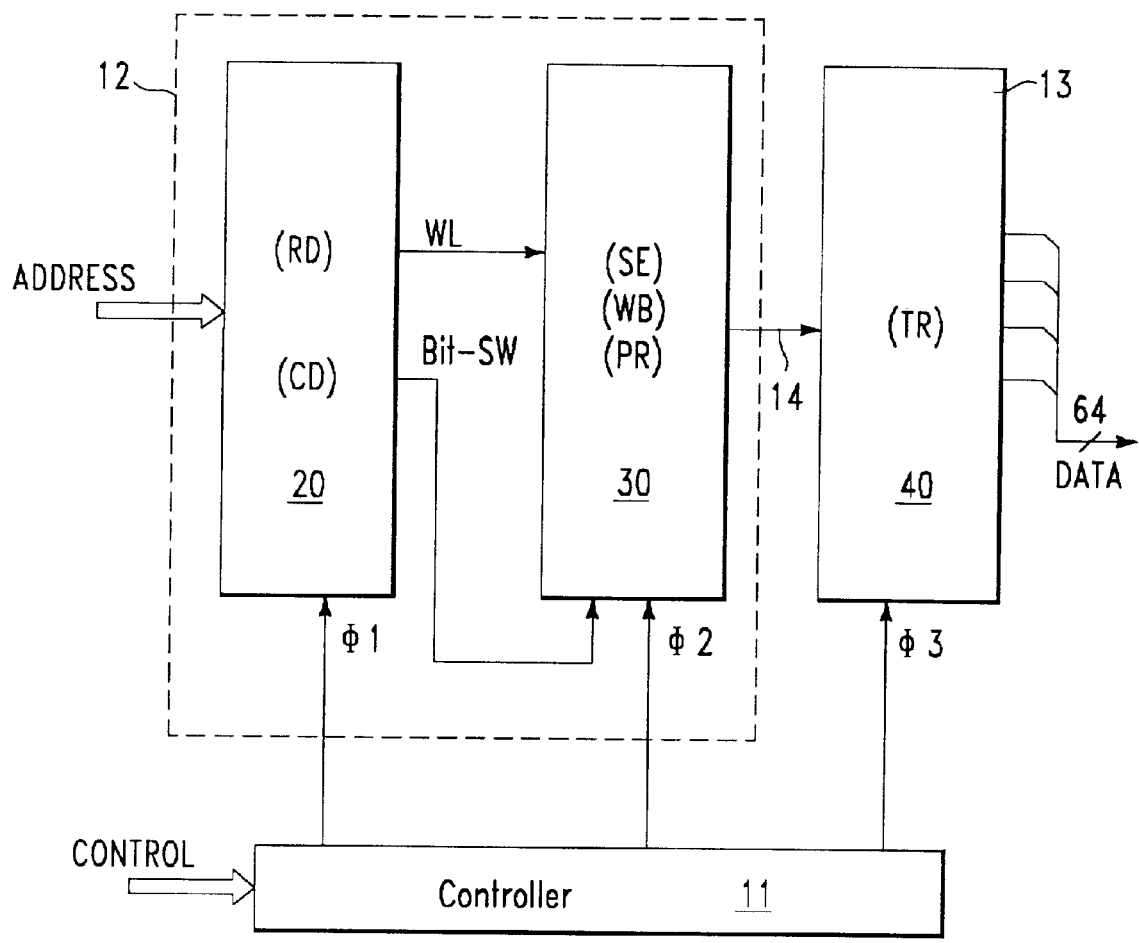
FIG. 5 is a drawing disclosing the detail of the principle of a DRAM system according to the present invention.

FIG. 5 shows an example according to the present invention in which a pipelined DRAM is accessed through a DRAM controller 11. Here, the pipeline comprises three stages 20, 30 and 40. These stages include the final stage, a line buffer stage 40 for data transfer. The controller 11 generates three clock signals 1, 2 and 3 for control. The first clock signal 1 controls operations related to addresses for the pipelined DRAM. Thus, this signal corresponds to a RAS clock or CAS clock in the background art. Please note that since in the present scheme, no address multiplexing is used, row and column addresses are fetched at the same time. The second clock signal 2 controls the operational processes in the memory array. The third clock signal 3 controls the processes in data transfer by being supplied to the line buffer 13.

Hereinafter, a memory access operation of the DRAM will be divided into the following cycles, and simplified for purposes of description:

RD: Row address decode path (path directly before the word line driver, relating to input and decoding of row addresses);

CD: Column address decode path (path directly before the bit switch, relating to input and decoding of column addresses);

SE: Path for sensing the potential of a cell in the array;

WB: Path related to operations for writing back the potential sensed in a cell in the array;

PR: Path related to precharging operations of the array for equating the bit line potential to the intermediate potential; and TR: Path transferring data from the line buffer to an external bus.

When the individual paths are classified/defined in such a manner, the following three parameters may be issues in the design of an interface for DRAM:

RAS cycle (RD+SE+WB+PR);

Array time constant (SE+WB+PR); and

Transfer cycle (product of the number of continuous bits relevant to a burst transfer and the TR).

Referring to FIG. 5, the first signal 1, the second signal 2 and the third signal 3 are timing signals to be supplied to means 20 in charge of decoding, means 30 in charge of operation inside the array and means 40 in charge of data transfer, respectively. Incidentally, these means are conceptual and do not necessarily indicate corresponding real mechanisms. As shown in FIG. 5, the decoding of a row address (RD) and the decoding of a column address (CD) take place in means 20 in charge of decoding. As a result of RD, a predetermined word line (WL) is chosen, whereas a predetermined bit switch (Bit-SW) is chosen as a result of CD. The timing for these is controlled by the first signal 1 supplied by the controller 11. For a predetermined word line that is accessed, means 30 in charge of operation in the array executes sensing (SE), writing back (WB) and precharging (PR). The timing for these is controlled by the second signal 2 supplied by the controller 11. After the completion of this, a bit coupled to a predetermined bit switch from said predetermined word line that was sensed is chosen by making use of the result of CD. The timing for this is also controlled by the second signal 2. While being controlled by the second signal 2, the data are transferred through the internal bus 14 to the line buffer 13 (means 40 in charge of data transfer). Thereafter, while being controlled by the control signal 3 supplied from the controller 11, data are transferred to the external bus. Transfer can employ either a single mode or a burst mode.

One feature of the present invention is that, together with achieving the pipelining of operation by the provision of means 20 in charge of decoding (referred to as decode handling means 20 hereinafter), means 30 in charge of operation inside the array (referred to as internal operation handling means 30 hereinafter) and means 40 in charge of data transfer (referred to as data transfer means 40 hereinafter), individual pipelines are made controllable with the first signal 1, the second signal 2 and the third signal 3 independently supplied from the controller 11, respectively.

Another feature is that a controller 11 integrated onto the same chip as the DRAM array 10 controls individual pipeline means independently by generating a plurality of signals 1, 2 and 3, which enables the timing signals to be controlled with higher accuracy than achieved by the control of RAS and CAS in the background art with the DRAM control logic installed outside the chip on which the DRAM is integrated. As a result, an effect of drastically speeding the fetching of data from the DRAM array is obtained.

Furthermore, with the present invention, a line buffer 13 is integrated onto the same chip as the DRAM array 10, which enables data to be burst-transferred at a very high frequency. As same with the speeding up of data fetching from the DRAM array, this is because the pipelined means relevant to burst transfer is controlled with a signal generated by the controller 11 integrated onto the same chip as the DRAM array 10. In addition, because the DRAM array 10 and the line buffer 13 are connected through an internal bus 14 that is large in bandwidth, data fetching can follow the speeding-up of the data transfer rate.

Figure 6:
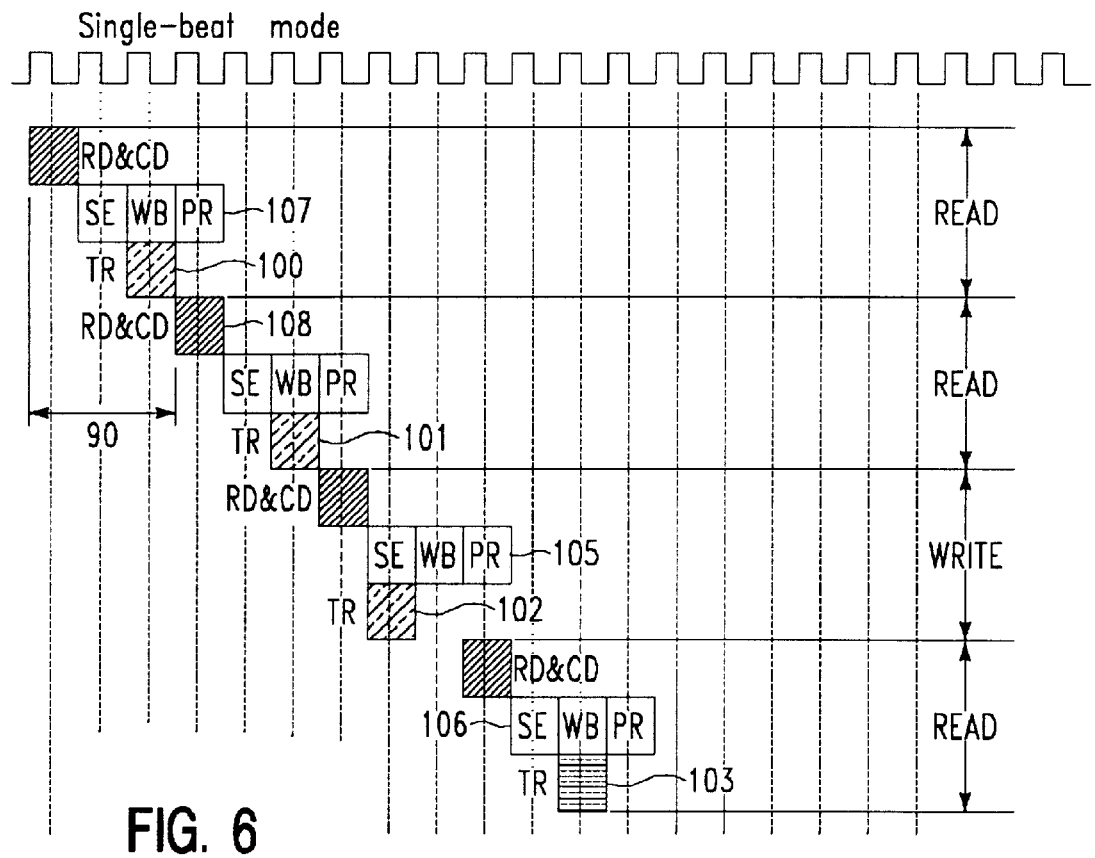
FIG. 6 is an operation chart of the present invention in a single-beat mode.

The reason for the generating of these advantages will be described assuming that one clock cycle is necessary for each cycle. FIG. 6 shows a timing chart for operation of the pipelined DRAM array in a single-beat transfer mode according to the present invention.

Referring to FIG. 5, the restrictive conditions (rules) for operation of a DRAM system according to the present invention are clarified as follows:

(1) In decode handling means 20, internal operation handling means 30, and data transfer means 40, the respective necessary operations are carried out independently. Accordingly, operation in each means is operable at mutually independent timing without being influenced by the timing of operations in other means. This is a principle in operation of a DRAM system according to the present invention. For example, RD/CD is performed in decode handling means 20 and PR is performed in internal operation handling means 30 independently of each other. Accordingly, RD/CD and PR are simultaneously operable in the same clock cycle.

(2) Internal operation handling means 30 never fails to operate in the particular sequence of SE, WB and PR. And, SE of the next cycle can start only after PR of the preceding cycle terminates.

(3) In a read mode, though RD and SE are performed in different means, SE cannot operate unless an address is supplied and therefore RD in decode handling means 20 must always precede SE (exception of (1)).

As compared with a conventionally known access method for a DRAM, the present invention has the following advantages in the aspect of performance. First, since a DRAM controller is integrated onto the same chip as with the DRAM cell, no multiplexing of addresses (alternate supply of row addresses and column addresses from the same pin) is necessary. Consequently, an address relevant to a row and column is immediately supplied and the decoding thereof can start simultaneously when an address and a start signal are supplied by the CPU. Secondly, internal pipelining of the DRAM enables the RD/CD stage after the start of operation to be concealed by the preceding array operation (SE+WB+PR). On referring to FIG. 6 in this respect, the cycle 90 extending from one RD to the next RD (hereinafter, referred to as the RAS time constant) has changed from 4 cycles to 3 cycles. Accordingly, data transfer TR also becomes possible every three cycles. For example, when read modes continue, a first TR 100 and a second TR 101 can arrive every 3 cycles. This is because RD becomes possible simultaneously with PR from the second access operation (e.g., PR 107 and RD 108 take place simultaneously).

Next, in switching from read mode to write mode, since TR becomes possible simultaneously with SE in write mode, TR can take place at intervals of only one clock cycle. For example, after TR 101 was accomplished in read mode, execution of TR 102 in write mode requires only 1 clock cycle for address decoding RD/CD in write mode between them.

On the contrary, on switching from write mode to read mode, a larger interval appears between TR in write mode and TR in read mode. For example, an interval as long as 3 clock cycles becomes necessary between TR 102 in write mode and TR 103 in read mode. This is because SE and TR can be executed in write mode (cf. 102) and the next SE 106 can start only after the preceding PR 105 terminates (rule 2 above).

As described above, the RAS time constant on switching of write mode/read mode becomes 3 clocks on average. Thus, according to the present invention, it is concluded that TR can be executed at intervals of 2 cycles on average or at intervals of 3 cycles regardless of whether there is mode switching or not.

Figure 7:
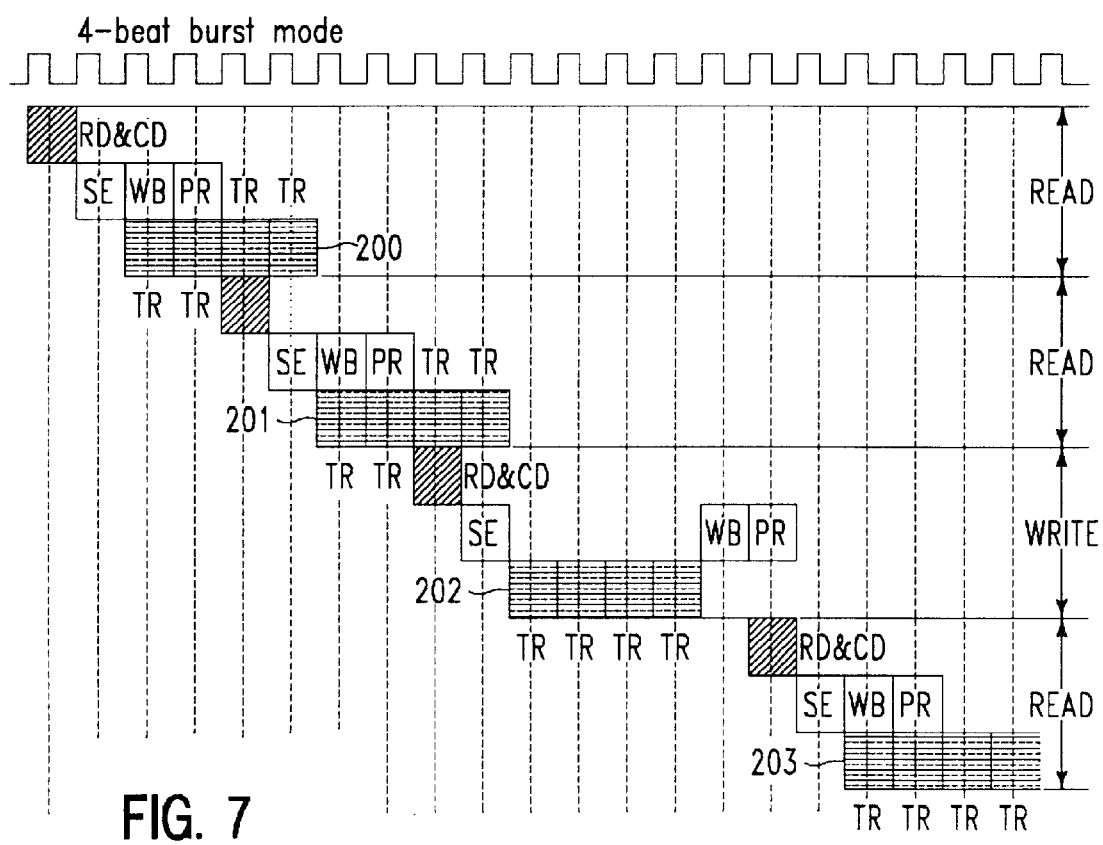
FIG. 7 is an operation chart of the present invention in a 4-beat burst mode.

As shown in FIG. 7, such advantages in data transfer become even more conspicuous when continuous 4-beat burst transfer takes place. Since it is normal for the CPU to have a first-order on-chip cache memory, the continuous burst mode is the operation mode that will be most usually performed for the operation of reading DRAM. As shown in FIG. 7, the TR stage continues during 4 clock cycles when a continuous 4-beat burst transfer takes place. Accordingly, the array time constant that continues during 3 clock cycles (SE+WB+PR) can be concealed by a TR stage that continues during for 4 clock cycles, which provides a bandwidth optimized for a fixed bus cycle length. Even if the bus cycle length is not fixed, uninterrupted data transfer is assured in read mode when the array time constant is shorter than the transfer cycle relevant to a continuous burst. And as long as use is made of a standard TTL interface, to effectively utilize a bus in this manner is highly important since the frequency of a bus clock on a planar board is limited. However, even according to the present invention, a time lag of 3 clock cycles cannot be eliminated at the switching from a write mode to a read mode.

FIG. 7 will be further described. In this case, the following rule is further added to the rules mentioned above.

(4) When read mode continues, the next TR cannot start unless the preceding TR terminates.

According to this rule, when read mode continues, the next TR 201 cannot start unless the preceding TR 200 terminates. Thus, it is sufficient if the corresponding SE terminates by the start time of the next TR 201. In write mode, WB and PR must take place only after all TRs for write terminate. Accordingly, a large lag time occurs at the next time of switching to read mode. To be brief, an interval as long as 3 clocks is required between the last TR 202 in write mode and the first TR 203 in read mode. This is because the next SE can take place only after the preceding PR (rule 2 above).

However, at least when read mode continues, or for a 4-beat burst mode when read mode switches over to write mode, its continuous bus use is assured, which is highly effective in the sense of raising the data transfer rate.

As described above, the present invention resembles the pipeline scheme in the background art or a more concrete technique, the synchronous DRAM in pipelining, and in using burst transfer, the burst EDO scheme in the background art. Furthermore, as a general scheme for raising the data transfer rate in the background art, there is the cache DRAM. Hereinafter, the superiority of the present invention will be pointed out as compared with these conventional techniques.

Pipeline Scheme

A pipeline scheme means a scheme for dividing memory system operation into several operational blocks and actuating the blocks in parallel. The employment of this scheme in a column access bus such as SRAM or synchronous DRAM is already known. With these techniques, however, pipelining is fulfilled in single access mode only.

The present invention differs from conventional pipelining in that pipelining of paths for accessing rows and pipelining of synchronous burst transfer from the line buffer are united. In short, it is thought that this is an optimal solution for achieving an upgrade in the data transfer rate of DRAM. In addition, with the background art, the control logic for DRAM was not integrated together with a DRAM array onto one and the same chip (on-chip integration). With the present invention, however, on-chip integration of a DRAM control logic with a DRAM array enables an extremely speedy data transfer rate to be supported because the DRAM array is controlled by the on-chip integrated DRAM control logic. In other words, except with on-chip integration of a DRAM control logic, control of high-speed pipelined burst transfer becomes extremely complicated and difficult; with increasing clock speed, it becomes extremely difficult on account of clock skew and the like to execute control of high-speed and precise timing by using an off-chip control logic.

Synchronous Dram

The synchronous DRAM is a scheme for synchronizing serial read/write operations by using an external clock. The present invention can be understood to be one type of synchronous DRAMs but is characterized by low cost, no need for address multiplexing and possession of a single bank as compared with a conventional synchronous DRAM. Advantages of the present invention over a conventional synchronous DRAM are mentioned as follows:

(1) A conventional synchronous DRAM has required a great deal of labor in testing because of having a great variety of access modes. In contrast, with a DRAM according to the present invention, the types of access modes are limited due to their optimization as uses for main memory and therefore a small amount of labor in testing will suffice.

(2) As a result of a reduced number of access modes, the present invention can support a burst transfer of the CPU without setting the internal mode register or without interrupting a burst access midway and therefore a small overhead is assured in memory access.

(3) A conventional synchronous DRAM does not dispense with the multiplexing input of addresses, whereas the present invention does not need this and accordingly can be satisfied with a shorter leadoff time than that of a conventional synchronous DRAM. In addition, since setting of the mode register is unnecessary, there is another merit of being easier to use.

(4) As compared with a conventional synchronous DRAM, only a small modification from the standard DRAM design will suffice.

(5) Provision of an additive pipelined stage in a path for decoding a row address enables the bandwidth of a memory to approach extremely close to the array time constant.

Burst Edo Scheme

In normal page mode, a burst transfer is also terminated with the termination of a column address strobe. With a burst EDO scheme, however, data continues to be burst-outputted till the start of the next column address strobe. In this respect, the data transfer rate can be increased according to this scheme. The present invention resembles the burst EDO scheme in executing a burst transfer. However, the present invention can further speed up the data transfer rate in comparison to the burst EDO scheme. This is partly because no address decoding for selection of a bank is performed in the memory controller, partly because no multiplexing of addresses is required, and partly because latching of an addresses and transfer of data are synchronized directly with the external clock.

Cache Dram

A cache DRAM is a DRAM having an on-chip cache memory connected to the DRAM body through a large-bandwidth internal bus. The present invention is superior to a cache DRAM in the following respects.

Without use of SRAM or cache control logic, the present invention can implement a single-chip integrated memory system of equal performance by a combination of the DRAM control logic and the pipelined DRAM array. Thus, lower price and smaller power consumption are assured than a cache DRAM.

As with the cache DRAM, in the present invention the maximum bandwidth of data is also restricted by the external bus clock. The operational performance is determined by the address pipeline ratio for the present invention and by the cache hit ratio for the cache DRAM. With the present invention, however, the penalties such as delay due to an address pipeline miss are extremely small. This is because the DRAM control logic is integrated into the same chip as the pipelined DRAM array.

Essentially, the present invention is a single-chip integrated main memory constructed for the purpose of excluding an external cache memory but can be referred to as a fully-associative DRAM cache memory with a 100% hit ratio from another point of view. It can be said that the cache data memory is enlarged to a size close to that of the main memory and accordingly the step of comparing tags becomes unnecessary. Such features of the present invention are most suitable for multimedia use. Multimedia use requires high-speed transfer of an extremely large quantity of data and a conventional cache scheme is not applicable to multimedia. In other words, a conventional cache DRAM does not have sufficient performance to meet this requirement. This is because the cache hit ratio is restricted by the size of the SRAM and the data transfer rate is restricted by the bandwidth of the DRAM.

As should now be understood the present invention has a DRAM control logic and a DRAM array mounted on one and the same chip. This is because use of an ultra-high-density DRAM enables the main memory to consist of a single or a few DRAM chips. Also, the present invention controls a pipelined DRAM by means of a clock generated by a DRAM control logic. If joined to (1), this has a great significance. That is, since no clock skew between the external control logic and the DRAM array should be considered, unlike in the background art, extremely rapid data transfer operations can be implemented. In addition, the present invention executes a synchronous burst transfer from a line buffer as the final stage of the pipeline. Since the final stage becomes a stage corresponding to an address decoding operation and array operation of a DRAM, it becomes possible to output data to or input data from the outside in coordination with these operations. Thus, the bus cycle becomes fully usable. Moreover, the above features enable the period for data input/output in burst mode to be made longer than that for operations inside the DRAM array. Thus, optimum data transfer operation can be achieved without interposing a clock cycle between the burst transfers.

Although the invention has been described in detail herein with reference to its preferred embodiment, it is to be understood that this description is by way of example only, and is not to be construed in a limiting sense. It is to be further understood that numerous changes in the details of the embodiments of the invention, and additional embodiments of the invention, will be apparent to, and may be made by, persons of ordinary skill in the art having reference to this description. It is contemplated that such changes and additional embodiments are within the spirit and true scope of the invention as claimed below.

What is claimed is:

1. A DRAM system comprising:
   (a) a chip, a DRAM array mounted on said chip wherein operations of the entire DRAM array including sensing, writing back, and precharging memory cells are pipelined with a plurality of pipelined stages, and
   (b) a control logic mounted on said chip for controlling said DRAM array, wherein said control logic generates a signal for controlling said plurality of pipelined stages;

(c) buffer means mounted on said chip for storing data being fetched from said DRAM array, and to input/output said data in a burst mode;

wherein the control logic controls the bidirectional data transfer between the pipeline stages and the buffer means;

wherein said plurality of pipeline stages having a first stage for setting an address from which data is to be fetched and a second stage for performing internal memory operation in said DRAM array.

2. A DRAM system as recited in claim 1, wherein row and column addresses are fetched at the same time.

3. A DRAM system as recited in claim 2, wherein said control logic is connected to a CPU which is not mounted on said chip.

4. A method for operating a DRAM system having a DRAM array having a plurality of pipelined stages, a control logic and a buffer mounted on a chip including the steps of:

(a) generating a signal for controlling said plurality of pipelined stages having a first stage for setting an address from which data is to be fetched and a second stage for performing internal memory operation in said DRAM array;

(b) storing data being fetched from said DRAM array;

(c) performing internal memory operation in said DRAM array; and (d) transferring a data output in a burst mode in which a first period to transfer said data in said burst mode is longer than a second period for performing said internal memory operation in said DRAM array.

5. A method as recited in claim 4, wherein the transferring of said data between a first data output and a second data output occurs without interposing a clock cycle between the burst mode.

* * * * *